(12) United States Patent
McBroom et al.

(10) Patent No.: US 9,188,651 B2
(45) Date of Patent: Nov. 17, 2015

(54) RADIO FREQUENCY (RF) BODY COIL ASSEMBLY FOR DUAL-MODALITY IMAGING

(71) Applicant: General Electric Company, Schenectady, NY (US)

(72) Inventors: Gary McBroom, Dousman, WI (US); Anton Linz, Mukwonago, WI (US); David McDaniel, Dousman, WI (US); Edward Emaci, Brookfield, WI (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 14/671,198

(22) Filed: Mar. 27, 2015

(65) Prior Publication Data

US 2015/0198682 A1 Jul. 16, 2015

Related U.S. Application Data

(62) Division of application No. 13/363,862, filed on Feb. 1, 2012, now Pat. No. 9,041,397.

(51) Int. Cl.
| | |
|---|---|
| *G01V 3/00* | (2006.01) |
| *G01R 33/34* | (2006.01) |
| *G01R 33/48* | (2006.01) |
| *G01R 33/422* | (2006.01) |

(52) U.S. Cl.
CPC .......... *G01R 33/34* (2013.01); *G01R 33/34076* (2013.01); *G01R 33/422* (2013.01); *G01R 33/481* (2013.01); *G01R 33/4808* (2013.01); *G01R 33/34007* (2013.01)

(58) Field of Classification Search
CPC ...................................................... G01R 33/481
USPC .................................................... 324/318, 322
See application file for complete search history.

(56) References Cited

U.S. PATENT DOCUMENTS

| | | | | |
|---|---|---|---|---|
| 5,017,872 | A | * | 5/1991 | Foo et al. ........................ 324/322 |
| 5,619,996 | A | * | 4/1997 | Beresten ........................ 600/422 |
| 6,084,409 | A | * | 7/2000 | Zebelein et al. ............... 324/318 |
| 6,294,972 | B1 | * | 9/2001 | Jesmanowicz et al. ........ 335/301 |
| 7,667,457 | B2 | | 2/2010 | Linz et al. |
| 7,835,782 | B2 | | 11/2010 | Cherry et al. |
| 8,041,414 | B2 | | 10/2011 | Peter et al. |
| 8,334,697 | B2 | | 12/2012 | Overweg et al. |
| 2008/0267478 | A1 | | 10/2008 | Eberler et al. |

* cited by examiner

*Primary Examiner* — Louis Arana
(74) *Attorney, Agent, or Firm* — Dean D. Small; The Small Patent Law Group, LLC.

(57) ABSTRACT

A radio frequency (RF) body coil assembly includes a coil support structure including an inner tubular member, an outer tubular member disposed radially outwardly from the inner tubular member, and a structural material disposed between the inner and outer tubular members, an RF coil mounted to an inner surface of the coil support structure, and a positron emission tomography (PET) detector assembly mounted to an outer surface of the coil support structure. A dual-modality imaging system is also described.

9 Claims, 8 Drawing Sheets

RADIO FREQUENCY (RF) BODY COIL ASSEMBLY FOR DUAL-MODALITY IMAGING

CROSS-REFERENCE TO RELATED APPLICATION

The present application is a divisional of U.S. patent application Ser. No. 13/363,862, filed on Feb. 1, 2012, which is incorporated by reference in its entirety.

BACKGROUND OF THE INVENTION

The subject matter disclosed herein relates generally to imaging systems, and more particularly to a radio frequency (RF) body coil for dual-modality imaging.

Magnetic resonance imaging (MRI) is a medical imaging modality that generates images of the inside of a human body without using x-rays or other ionizing radiation. MRI uses a magnet to create a strong, uniform, static magnetic field (i.e., the "main magnetic field") and gradient coils to produce smaller amplitude, spatially varying magnetic fields when a current is applied to the gradient coils. When a human body, or part of a human body, is placed in the main magnetic field, the nuclear spins that are associated with hydrogen nuclei in tissue water become polarized. The magnetic moments that are associated with these spins become preferentially aligned along the direction of the main magnetic field, resulting in a small net tissue magnetization along that axis (the "z axis," by convention) and the gradient coils encode the MR signal.

RF coils are used to create pulses of RF energy at or near the resonance frequency of the hydrogen nuclei, also referred to herein as the Larmor frequency. These RF coils are used to transmit RF excitation signals and receive MR signals used to form the images. Various types of RF coils may be used in an MRI system such as a whole-body RF coil and an RF surface (or local) coil.

It may be desirable to incorporate the functionality of a positron emission tomography (PET) imaging system and the functionality of the MRI imaging system in a dual-modality imaging system. To form the dual-modality imaging system, the RF coil and a PET detector are both arranged within the magnet. For optimal imaging system performance, it is desirable that the PET detector and the RF coil occupy the same general physical space within the magnet. Moreover, conventional PET detectors are relatively heavy and should be supported and held in place with positional accuracy. Additionally, the PET detectors should be shielded from the RF generated by the RF coil. However, the addition of the PET detectors within the MRI imaging system may reduce the size of the patient bore and therefore limit the size of a patient that may be scanned using the dual-modality imaging system.

BRIEF DESCRIPTION OF THE INVENTION

In one embodiment, a radio frequency (RF) body coil assembly is provided. The RF body coil assembly includes a coil support structure including an inner tubular member, an outer tubular member disposed radially outwardly from the inner tubular member, and a structural material disposed between the inner and outer tubular members, an RF coil mounted to an inner surface of the coil support structure, and a positron emission tomography (PET) detector assembly mounted to an outer surface of the coil support structure.

In another embodiment, a radio frequency (RF) body coil assembly is also provided. The RF body coil assembly includes a coil support structure including an inner tubular member, an outer tubular member disposed radially outwardly from the inner tubular member, and a structural material disposed between the inner and outer tubular members, an RF coil mounted to an inner surface of the coil support structure, and an RF shield disposed on an outer surface of the coil support structure.

In a further embodiment, a dual-modality imaging system is provided. The dual modality imaging system includes a gradient coil and a radio frequency (RF) body coil assembly disposed radially inwardly from the gradient coil. The RF body coil assembly includes a coil support structure having an inner tubular member, an outer tubular member disposed radially outwardly from the inner tubular member, and a structural material disposed between the inner and outer tubular members, an RF coil mounted to an inner surface of the coil support structure, and a positron emission tomography (PET) detector assembly mounted to an outer surface of the coil support structure.

DETAILED DESCRIPTION OF THE INVENTION

Various embodiments will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide a radio frequency (RF) body coil assembly that generally includes both an RF coil and a positron emission tomography (PET) detector assembly. The RF coil is arranged with respect to the PET detector assembly such that the inside diameter of the patient bore is not substantially reduced based on the addition of the PET detector assembly. In various embodiments, the RF body coil assembly includes a coil support structure that provides mounting surfaces for both the RF body coil elements and the RF shielding. The coil support structure also provides mounting and structural support for the PET detector assembly.

Figure 1:
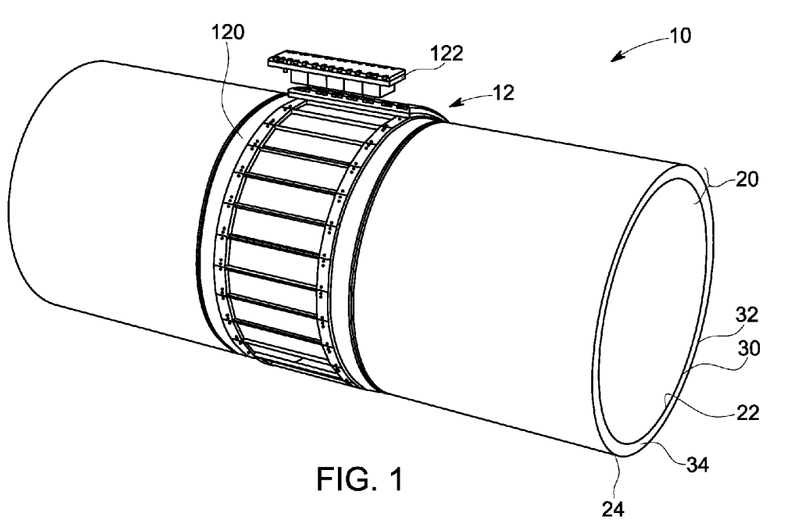
FIG. 1 is a side perspective view of an exemplary radio frequency (RF) body coil assembly formed in accordance with various embodiments.
Figure 2:
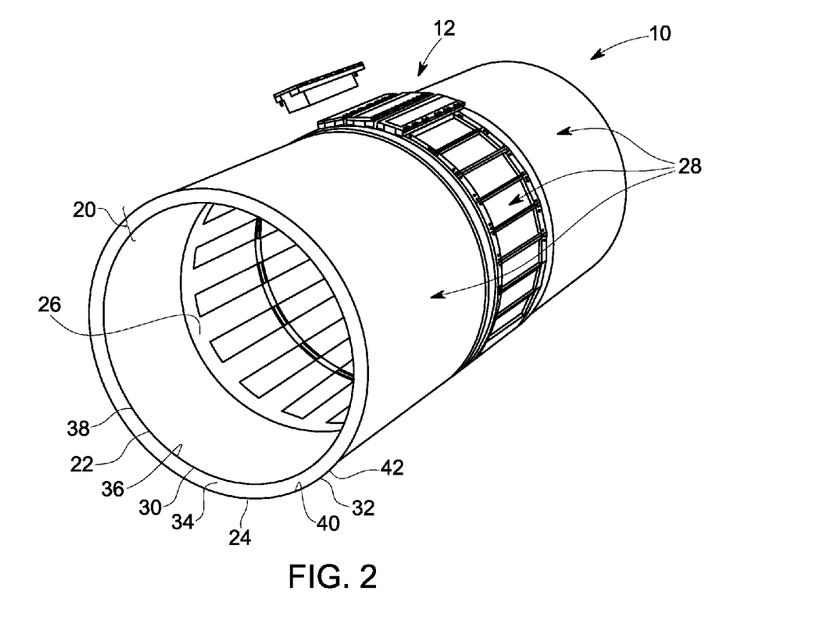
FIG. 2 is a front perspective view of the exemplary RF body coil assembly shown in FIG. 1.
Figure 3:
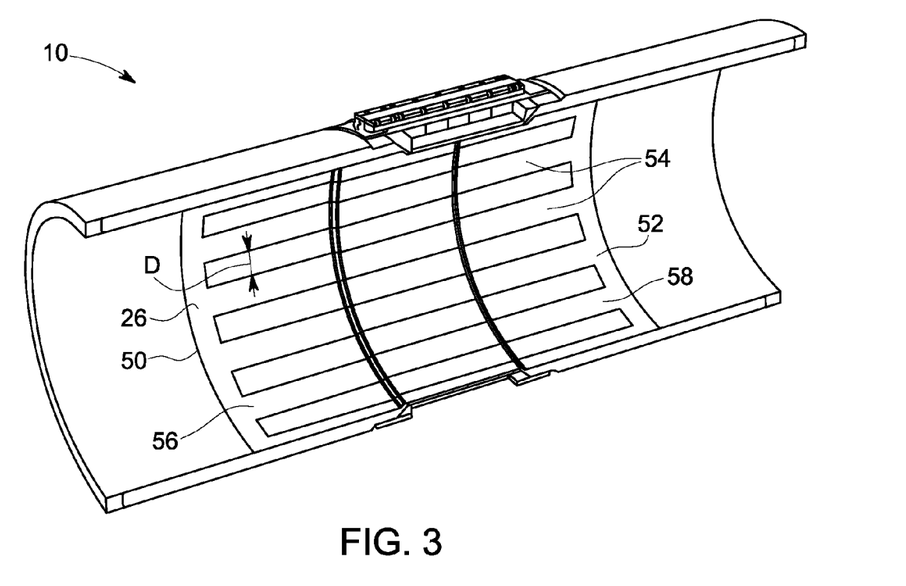
FIG. 3 is a side perspective cross-sectional view of the exemplary RF body coil assembly shown in FIG. 1.
Figure 4:
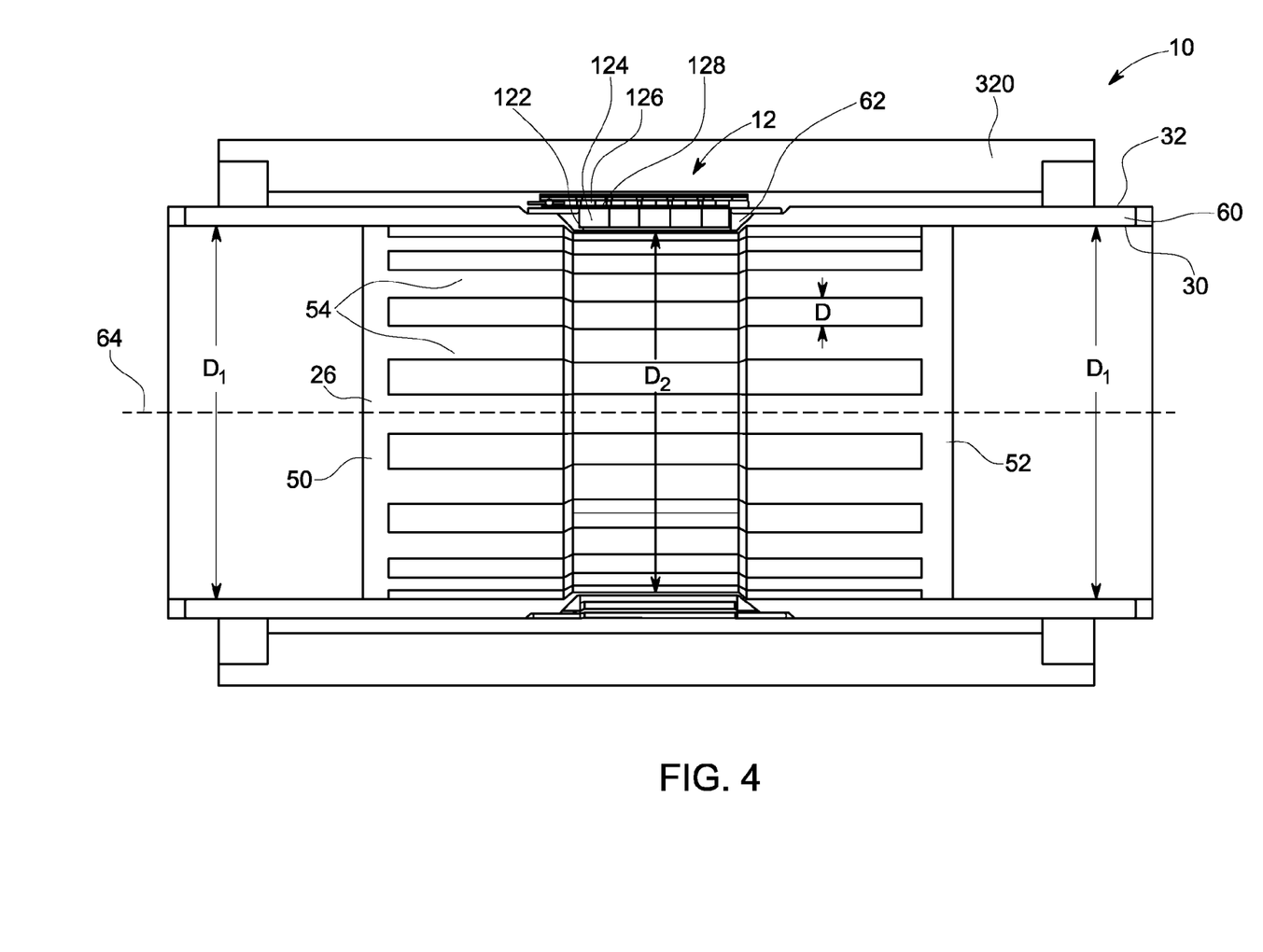
FIG. 4 is a side cross-sectional view of the exemplary RF body coil assembly shown in FIG. 1.

FIG. 1 is a side perspective view of an exemplary RF body coil assembly 10 formed in accordance with various embodiments. FIG. 2 is a front perspective view of the exemplary RF body coil assembly 10 shown in FIG. 1. FIG. 3 is a side perspective cross-sectional view of the exemplary RF body coil assembly 10 shown in FIG. 1. FIG. 4 is a side cross-sectional view of the exemplary RF body coil assembly 10 shown in FIG. 1. As shown in FIGS. 1 and 2, the assembly 10 is configured to include a PET detector assembly 12. The assembly 10 includes a coil support structure 20 having a radially inner surface 22 and a radially outer surface 24. The assembly 10 further includes an RF coil 26 that is mounted to the radially inner surface 22 and an RF shield 28 that is mounted to the radially outer surface 24.

As shown in FIGS. 1 and 2, the coil support structure 20 includes an inner tubular member 30, and outer tubular member 32, and a gap 34 that is defined between the inner and outer tubular members 30 and 32, respectively. The inner tubular member 30 includes an inner surface 36, that also forms the inner surface 22 of the assembly 10, and a radially outer surface 38. The outer tubular member 32 includes an inner surface 40 and a radially outer surface 42, that also forms the outer surface 24 of the assembly 10. Thus, the outer surface 38 and the inner surface 40, of the inner and outer tubular members 30 and 32, respectively, define the gap 34.

In various embodiments, the inner and outer tubular members 30 and 32 are fabricated from a material that has relatively low attenuation properties to enable gamma emissions to pass through the inner and outer tubular members 30 and 32. Moreover, the inner and outer tubular members 30 and 32 are fabricated from a material that has a relatively high structural strength to enable both the RF coil 26 and the PET detector assembly 12, described below, to be mounted on the coil support structure 20. In various embodiments, the inner and outer tubular members 30 and 32 may be fabricated from, for example, aramid fibers that are woven into sheets to form the inner and outer tubular members 30 and 32.

As shown in FIG. 2, in the exemplary embodiment, the RF coil 26 is mounted to the inner surface 36 of the inner tubular member 30. Referring to FIGS. 3 and 4, in various embodiments, the RF coil 26 is embodied as a birdcage coil that includes a first end ring 50, a second end ring 52 and a plurality of rungs 54 that are electrically coupled between the first and second end rings 50 and 52, respectively. Each of the plurality of rungs 54 includes a first end 56 and a second opposite end 58. In the exemplary embodiment, the first end 56 of each rung 54 is electrically coupled to the first end ring 50 and the second end 58 of each rung 54 is electrically coupled to the second end ring 52. The rungs 54 may be coupled to each of the end rings 50 and 52 using, for example, solder. In other embodiments, the rungs 54 may be coupled to each of the end rings 50 and 52 using, for example, an electrically conductive adhesive. Thus, in various embodiments, the coil support structure 20 may function as a coil former for mounting the RF coil 26.

As shown in FIGS. 3 and 4, the first end ring 50 and the second end ring 52 oppose one another in a spaced-apart relationship and are connected by the plurality of rungs 54 such that the RF coil 26 is substantially cylindrical in shape with annular ends. The rungs 54 are arranged circumferentially around the end rings 50 and 52 and are, in the exemplary embodiment, uniformly spaced apart from one another. It should be realized that the RF coil 26 may have fewer or more rungs 54 than the illustrated embodiment. The quantity of rungs 54 may be selected based on the requirements of a particular imaging application. For example, the quantity of rungs 54 may be selected based on a desired field-of-view (FOV), a desired image resolution, a desired power requirement and/or a desired imaging speed. More specifically, the RF coil 26 includes N rungs 54 which are radially separated from each other by a distance D. In various embodiments, N may be 8, 16, 24, or 32, for example. In the exemplary embodiment, N=16.

Figure 5:
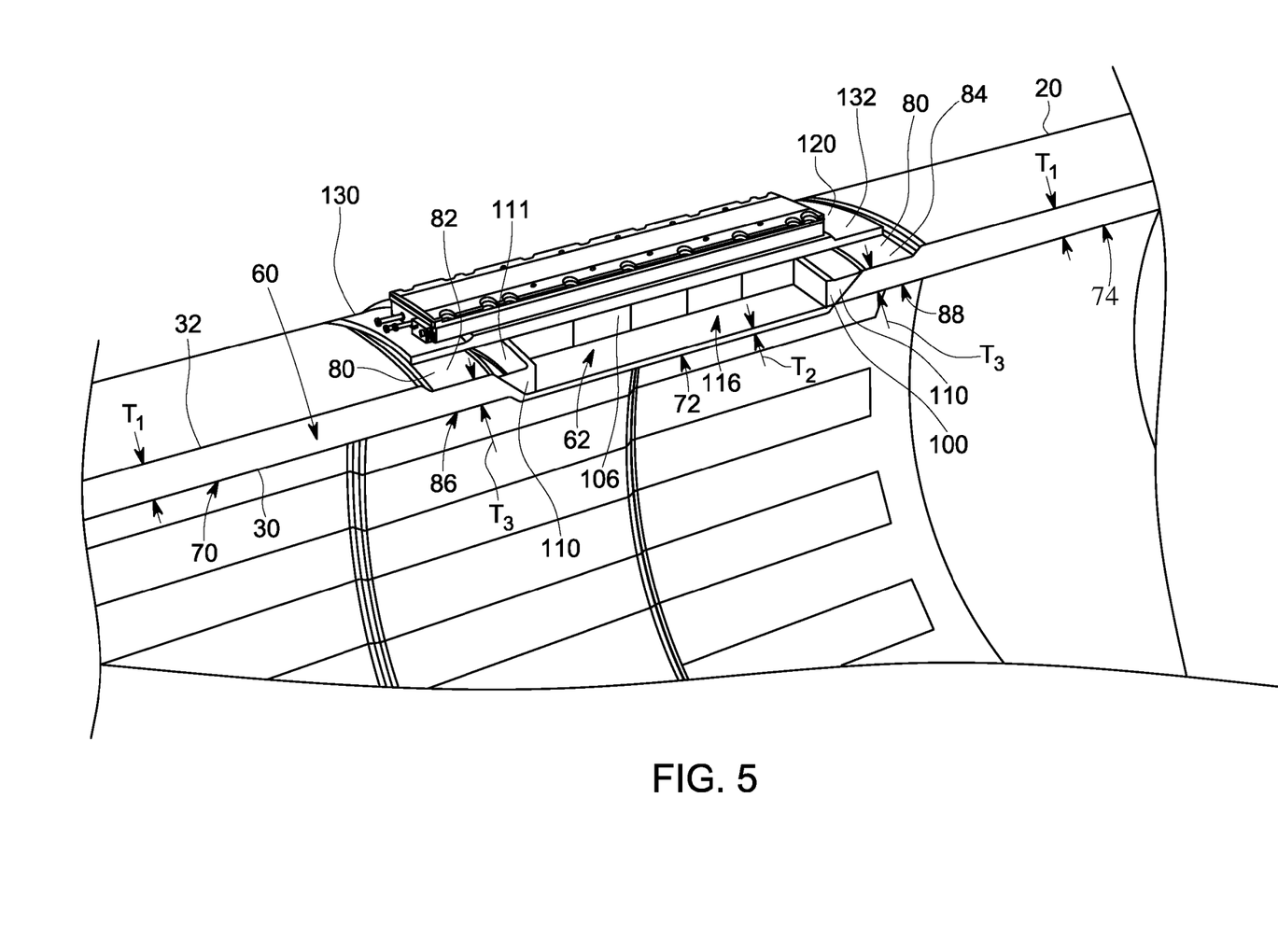
FIG. 5 is a side cross-sectional view of a portion of the exemplary RF body coil assembly shown in FIG. 1.

FIG. 5 is a side cross-sectional view of a portion of the exemplary RF body coil assembly 10 shown in FIGS. 1-4. In various embodiments, and as described above, the coil support structure 20 includes the inner tubular member 30, the outer tubular member 32, and the gap 34 that is defined between the inner and outer tubular members 30 and 32, respectively. In various embodiments, the gap 34 is filled with a structural material 60 that is disposed between the inner and outer tubular members 30 and 32, respectively.

In use, the structural material 60 is configured to improve the structural strength to the coil support structure 20 to enable both the RF coil 26 and the PET detector assembly 12, described below, to be mounted on the coil support structure 20. More specifically, the structural material 60 forms a substantially solid core of the coil support structure 20. In various embodiments, the structural material 60 may be embodied as a solid foam material such that the combination of the inner tubular member 30, the outer tubular member 32, and the structural material 60 form a structural layered or sandwiched arrangement. The structural material 60 may be fabricated from, for example, a polyurethane material or other suitable material that is compatible with MR imaging systems.

Referring to FIGS. 4 and 5, the coil support structure 20 is formed to include a recess or channel 62 that is configured to receive a portion of the PET detector 12 therein. In various embodiments, the coil support structure 20 has a centerline axis 64 extending there through that defines an imaging plane of the assembly 10. In the exemplary embodiment, the channel 62 is disposed radially outwardly from the axis 64 and is formed circumferentially around the axis 64. More specifically, the coil support structure 20 has a first portion 70, a second portion 72, and a third portion 74. In various embodiments, the first, second, and third portions 70, 72, and 74 are formed unitarily such that the coil support structure 20 is formed as a unitary structure (e.g. integrally formed). The first portion 70 has an inner diameter $D_1$, the second portion 72 has an inner diameter $D_2$, and the third portion 74 has the inner diameter $D_1$ such that the inner diameter of the first portion 70 is substantially the same as the inner diameter of the third portion 74. In the exemplary embodiment, $D_1$ is larger than $D_2$, such that the inner diameters of the first and third portions 70 and 74 is larger than the inner diameter $D_2$ of the second portion 72 to form the channel 62 and to therefore enable a portion of the PET detector 12 to be coupled or mounted within the channel 62.

Moreover, the first portion 70, which includes the inner tubular member 30, the outer tubular member 32, and the material 60, has a first thickness $T_1$, the second portion 72, which includes the inner tubular member 30, the outer tubular member 32, and the material 60, has a second thickness $T_2$, and the third portion 74, which includes the inner tubular member 30, the outer tubular member 32, and the material 60, has the first thickness $T_1$. Accordingly, in the exemplary embodiment, $T_1$ is larger than $T_2$, such that the first and third portions 70 and 74 are thicker than the second portion 72 to form the channel 62 and to therefore enable a portion of the PET detector 12 to be mounted within the channel 62.

As shown in FIG. 5, the coil support structure 20 may also be formed to include a pair of mounting platforms 80 that are disposed on each side of the channel 62. More specifically, the coil support structure 20 includes a first mounting platform 82 that is disposed on a first side of the channel 62 and a second mounting platform 84 that is disposed on a second opposite side of the channel 62. In use, the channels are utilized to mount a detector support structure, that is described in more detail below, to the coil support structure 20. To form the mounting platform 82, a portion 86 of the first portion 70, which includes the inner tubular member 30, the outer tubular member 32, and the material 60, is formed to have a first thickness $T_3$ and a portion 88 of the third portion 74 is formed to have the same thickness $T_3$. Accordingly, in the exemplary embodiment, $T_3$ is smaller than $T_1$, such that mounting platforms 80 and 82 are recessed within the coil support structure 20 to a depth that is less than the depth of the channel 62.

Figure 6:
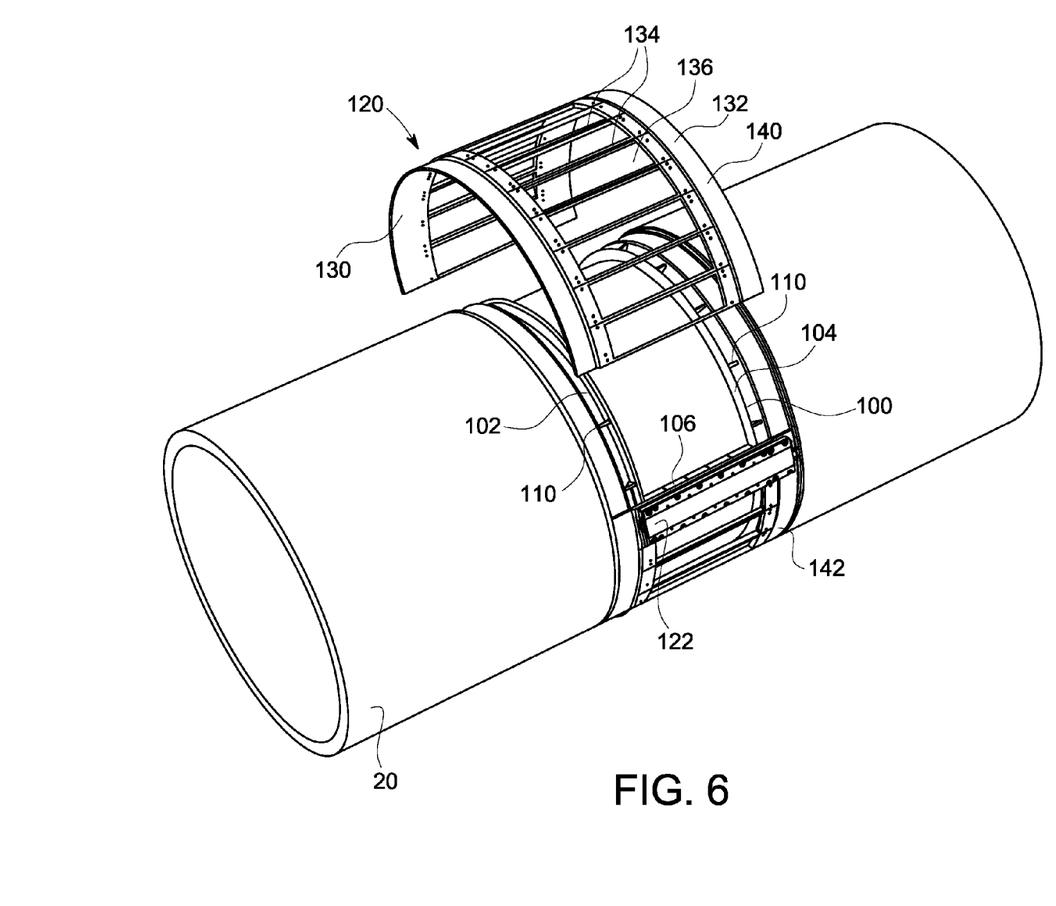
FIG. 6 is another side perspective view of the exemplary RF body coil assembly shown in FIG. 1 with a cage assembly partially removed.
Figure 7:
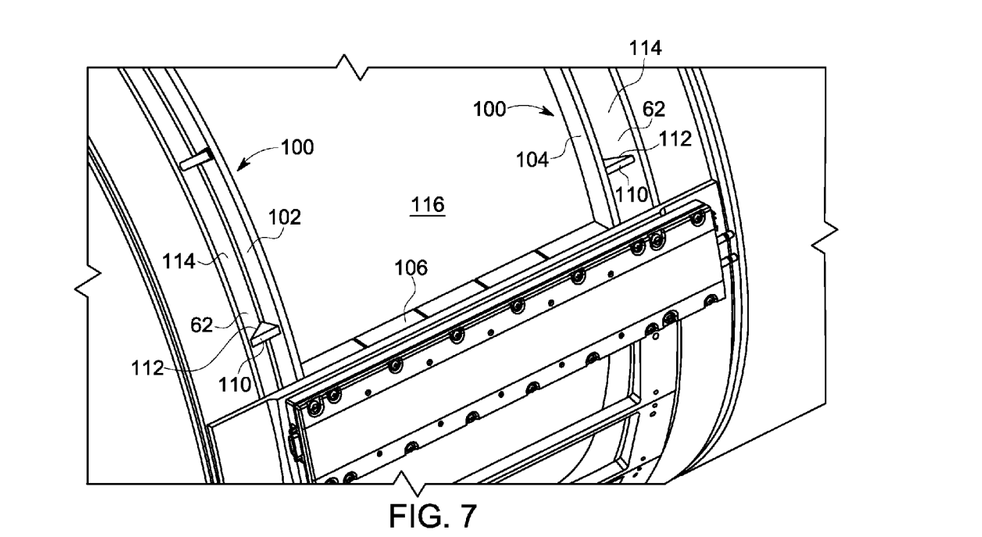
FIG. 7 is a side perspective view of a portion of the exemplary RF body coil assembly shown in FIG. 1.

In various embodiments, the coil support structure 20 further includes a scatter shield 100 that is configured to be installed within the channel 62. In use, the scatter shield 100 is configured to substantially inhibit gamma rays from affecting the operation of the PET detector 12. FIG. 6 is a perspective view of a portion of the assembly 10 including the scatter shield 100. FIG. 7 is perspective view of a portion of the scatter shield 100 shown in FIGS. 5 and 6. In various embodiments, the scatter shield 100 includes a first ring 102, a second ring 104, and a plurality of rungs 106 that are connected between the first and second rings 102 and 104, respectively. Accordingly, the scatter shield 100 is fabricated to form a birdcage-like structure wherein an area 116 between a pair of adjacent rungs 106 may be sized to receive a portion of the PET detector assembly 12 therein.

In various embodiments, each of the rings 102 and 104 includes a plurality of mounting tabs 110. As shown in FIGS. 4 and 6, the mounting tabs 110 have a beveled or tapered surface 112 that is shaped to substantially conform to a beveled surface 114 of the channel 62. Accordingly, during assembly, the scatter shield 100 is configured to be positioned at least partially within the channel 62. Moreover, the tabs 110 are configured to maintain the position of the scatter shield 100 within the channel 62. In various other embodiments, a portion of a volume 111 defined by the spacing between the tabs 110 may be filled with a scatter shield material. Thus, the scatter shield 100 would include the rings 102 and 104, and the material in the volume 111 having a cross-section similar to the cross-section of the tabs 110.

The scatter shield 100 is fabricated from a material that substantially inhibits gamma rays from affecting the operation of the PET detector 12. Accordingly, in various embodiments, the first and second rings 102,104 and the rungs 106 are fabricated from a relatively high density material to facilitate blocking gamma rays from affecting the operation of the PET detector 12. The inner and outer tubular members 30 and 32 may be fabricated from, for example, a nylon resin that is filled with a tungsten powder. More specifically, the first and second rungs 102,104 or the rungs 106 may be fabricated to include an outer casing that is has a substantially hollow interior portion. The outer casing may be fabricated using the nylon resin. Moreover, the interior hollow portion may then be filled with the tungsten powder. The combination of the nylon resin casing and the tungsten powder interior facilitates forming a scatter shield that substantially blocks gamma energy from affecting the operation of the PET detector 12.

In various other embodiments, the coil support structure 20 does not include the scatter shield 100 described above. Rather, the coil support structure 20 may include the plurality of rungs 106 that are coupled directly to a plurality of rungs that form the detector mounting structure described below.

Referring again to FIG. 1, in various embodiments, the PET detector assembly 12 includes a PET detector mounting structure or cage 120 and a plurality of PET detector modules 122 that are each configured to be inserted into, and supported by, the cage 120. In various embodiments, and as shown in FIG. 4, the detector modules 122 may each include a plurality of scintillators 124 and an electronics section 126. In operation, emission data representative of a first and second annihilation photon emitting from a region of interest are received by at least one of the scintillators 124. The scintillator 124, when having the incoming annihilation photon impinge thereon, absorbs the energy of the annihilation photon and re-emits the absorbed energy in the form of light. The light is then transmitted from the scintillator 124 to a light guide 128. The light guide 128 is configured to transmit the light received from the scintillator 124 to the electronics section 126 that converts the light from the scintillators 124 into an electric signal that is used to reconstruct an image of an object being scanned. The electronics section 126 may be embodied as any light sensor, such as for example, a photodiode.

Referring again to FIG. 6, in various embodiments, the cage 120 includes a first end ring 130, a second end ring 132, and a plurality of rungs 134 that are coupled between the first and second end rings 130 and 132, respectively. Accordingly, the cage 120 is fabricated to form a birdcage-like structure wherein an opening 136 between a pair of adjacent rungs 134 may be sized to receive a single PET detector module 122 therein.

In various embodiments, and as shown in FIG. 6, the cage 120 may be fabricated as two separate cage portions 140 and 142 that are coupled together after being installed on the coil support structure 20. Optionally, the cage 120 may be fabricated from three or more cage portions that are coupled together after being installed on the coil support structure 20.

The cage 120, in one embodiment, is fabricated from a fiberglass reinforced epoxy material to facilitate increasing the structural strength of the cage 120 and to thereby enable the detector modules 122 to be mounted to the coil support structure. In the exemplary embodiment, the cage 120 is coupled to the coil support structure 20 using the pair of mounting platforms 80. For example, and referring again to FIG. 5, the cage 120 may be coupled to the coil support structure 20 such that first end ring 130 is disposed within the first mounting platform 82, the second end ring 132 is disposed within the second mounting platform 84, and the rungs 134 extend across the channel 62. Accordingly, the openings 136 defined by the rungs 134 are disposed above the channel 62 to enable the PET detector modules 122 to each extend through a respective opening 136 and be partially disposed within the channel 62. Moreover, the openings 136 in the cage 120 are substantially aligned with the openings 116 in the scatter shield 100 to enable a single detector module 122 to be inserted through an opening 136 and a respective opening 116 such that the detector modules 122 mounted on the cage 120 fit into the areas defined by the openings 116 defined in the scatter shield 100.

In various other embodiments, as described above, the coil support structure 20 does not include the scatter shield 100 described above. More specifically, the coil support structure 20 may include the plurality of rungs 106 that are coupled directly to the plurality of rungs 134. For example, a single rung 106 may be coupled directly to a single rung 134. In this embodiment, the coil support structure 20 does not include the rings 102 and 104 to support the rungs 106 that function as a scatter shield. Rather, the rungs 134 of the cage 120 provide structural support for the rungs 106. In other embodiments, the rungs 134 may be fabricated from a gamma ray attenuating material and extend in the radial direction to cover the crystals.

In use, the cage 120 is configured to provide a mounting platform for the detector modules 122. Moreover, because the cage 120 is coupled to each side of the channel 62, via the first and second mounting platforms 82 and 84, the cage 120 facilitates increasing the structural integrity of the coil support structure 20. For example, as discussed above, the second portion 72 of the coil support structure 20 has a thickness that is less than the thickness of both the first and third portions 70 and 74. The second portion 72 is made thinner to provide the channel 62 which is used to mount both the scatter shield 100 and the detector modules 122. Accordingly, fabricating the cage 120 from a material that has increased structural strength, provides increased structural strength to the coil support structure 20 that is reduced by the channel 62 to provide mounting for the detector modules 122. More specifically, the cage 120 is configured to bridge the channel 62 and add structural integrity to the coil support structure 20 which was reduced to allow for the mounting of the PET detector modules 122. In various embodiments, the cage 120 may be coupled to the coil support structure 20 using an epoxy. Optionally, the cage 120 may be coupled to the coil support structure 20 using any suitable fastener.

Figure 8:
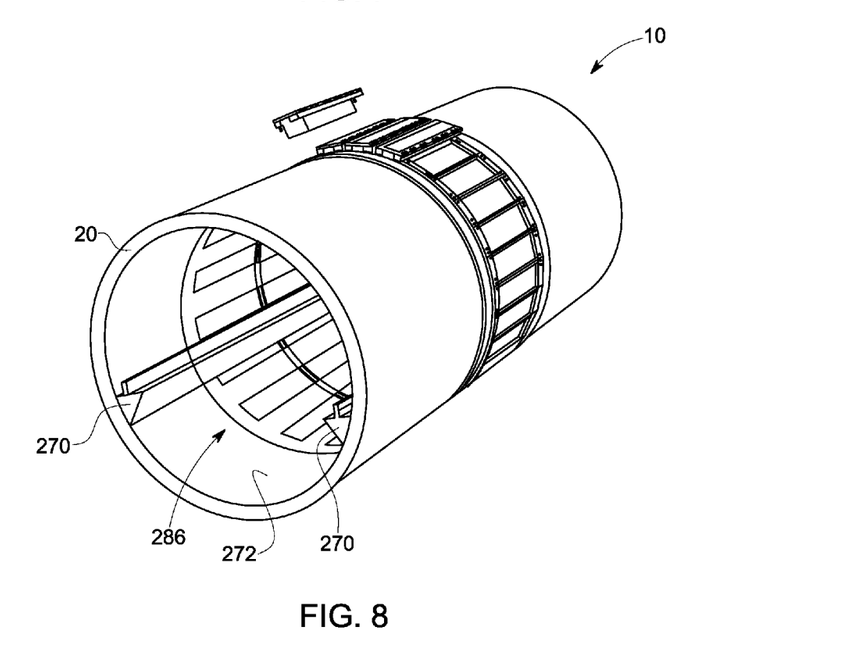
FIG. 8 is another perspective view of a portion of the exemplary RF body coil assembly shown in FIG. 1.
Figure 9:
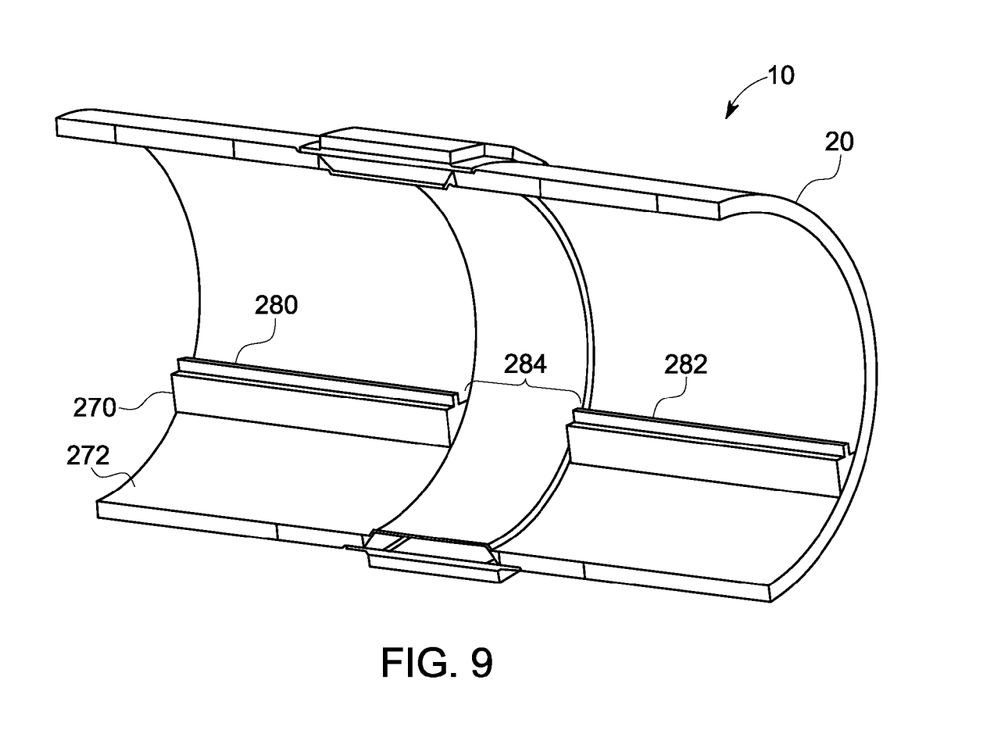
FIG. 9 is another side cross-sectional view of a portion of the exemplary RF body coil assembly shown in FIG. 1.

FIG. 8 is another front perspective view of the RF body coil assembly 10. FIG. 9 is a side cross-sectional view of a portion of the RF body coil assembly 10 shown in FIG. 8. The RF body coil assembly 10 also includes a pair of guide rails 270 that are coupled to an interior surface 272 of the coil support structure 20. In various embodiments, each of the guide rails may include a plurality of guide rail sections. For example, as shown in FIG. 8, each of the guide rails 270 includes a first guide rail section 280 and a second guide rail section 282 that is separated from the first guide rail section 280 by a gap 284. The first guide rail section 280 is aligned with the section guide rail section 282 to enable a cradle (not shown) to be moved in and out of an imaging space 286 within the RF body coil assembly 10. In the exemplary embodiment, the gap 284 is located radially inwardly from the PET detector assembly 12 such that the guide rails 270 do not interfere with the operation of the PET detector assembly 12.

Described herein is an exemplary RF coil assembly that includes a coil support structure. The coil support structure is fabricated to include an inner tube and an outer tube that is arranged coaxially with the inner tube. A space between the inner and outer tubes may be filled with a ridged foam or similar low density material. Optionally, the space between the inner and outer tubes may be left unfilled, or selectively filled using ribs, webs, or a honeycomb structure. A diameter of the outer tube is reduced for a region in the middle, leaving a radial volume of space for the PET detectors. The reduced diameter region is spanned with structural ribs placed circumferentially around the diameter. In use, the ribs add back structural integrity that was lost due to the reduction in diameter. Moreover, the ribs may be placed in the gaps formed between the PET detector modules to add additional structural strength without putting material in the path of the gamma signal originating from, for example, a patient. An RF shielding material or coating may be applied to the outside diameter of the outer tube. The RF transmitting elements are attached to the inner tube. This arrangement focuses the RF energy inward toward the patient while shielding the PET detectors from the RF energy. The RF coil assembly may also include lengthwise rails that are attached to the inside of the inner tube to provide surfaces for a patient transport cradle to roll or slide on. The rails also may provide an additional function to the structure and a system to provide patient support. The inner and outer tubes may be fabricated from different materials along their lengths. A low density material such as Kevlar™ may be used in the center section to facilitate minimizing the density of material in the gamma path. A material having a higher density may also be used for the end sections of the tube where gamma attenuation does not affect the operation of the RF coil assembly.

Moreover, because the RF coil and the RF shield are both rigidly mounted to the coil support structure, a distance between the RF coil and RF shield is maintained. More specifically, although the distance or gap between the RF coil and RF shield may vary based on the thickness of the coil support structure at various points along the length of the coil support structure, the distance or gap between the RF coil and the RF shield remains constant at each point along the length of the coil support structure. Therefore, in the exemplary embodiment, the RF coil does not move with respect to the RF shield and the tuning of the RF coil assembly remains substantially constant. More specifically, because the gap between the RF coil assembly and the RF shield is fixed, the tuning is also fixed.

Figure 10:
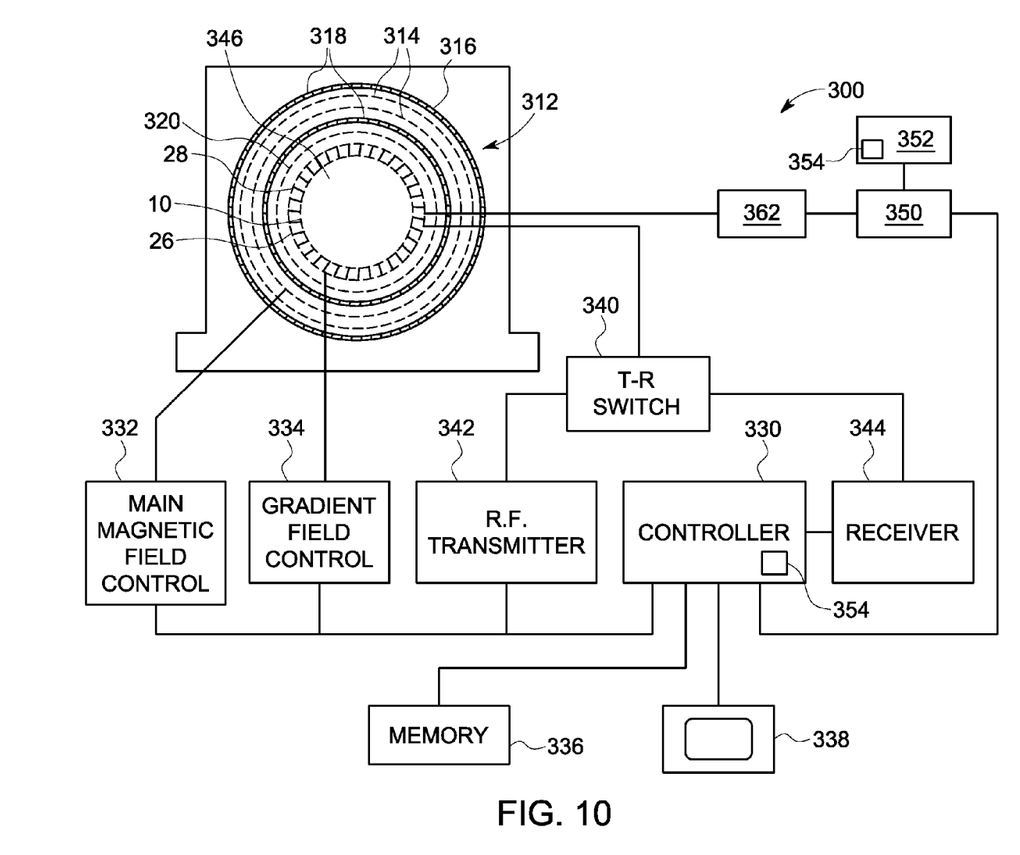
FIG. 10 is an exemplary dual-modality imaging system formed in accordance with various embodiments.

Various embodiments of the RF body coil assembly 10 described herein may be provided as part of, or used with, a medical imaging system, such as a dual-modality imaging system 300 as shown in FIG. 10. In the exemplary embodiment, the dual-modality imaging system is an MRI/PET imaging system that includes a superconducting magnet assembly 312 that includes a superconducting magnet 314. The superconducting magnet 314 is formed from a plurality of magnetic coils supported on a magnet coil support or coil former. In one embodiment, the superconducting magnet assembly 312 may also include a thermal shield 316. A vessel 318 (also referred to as a cryostat) surrounds the superconducting magnet 314, and the thermal shield 316 surrounds the vessel 318. The vessel 318 is typically filled with liquid helium to cool the coils of the superconducting magnet 314. A thermal insulation (not shown) may be provided surrounding the outer surface of the vessel 318. The imaging system 300 also includes a main gradient coil 320, and the RF coil assembly 10 described above that is mounted radially inwardly from the gradient coil 320. As described above, the RF coil assembly 10 includes both the RF transmit coil 26 and the RF shield 28. More specifically, the RF coil assembly 10 includes the coil support structure 20 that is used to mount the PET detector assembly 12, the RF transmit coil 26, and the RF shield 28.

In operation, the RF coil assembly 10 enables the imaging system 300 to perform both MRI and PET imaging concurrently because both the RF transmit coil 26 and the PET detector 12 are placed around a patient at the center of the bore of the imaging system 300. Moreover, the PET detector assembly 12 is shielded from the RF transmit coil 26 using the RF shield 28 that is disposed between the RF transmit coil 26 and the PET detector assembly 12. Mounting the PET detector assembly 12, the RF coil 26 and the RF shield 28 on the coil support structure 20 enables the RF coil assembly 10 to be fabricated to have an outside diameter that enables the RF coil assembly 10 to be mounted inside the gradient coil 320. Moreover, mounting the PET detector assembly 12, the RF coil 26 and the RF shield 28 on the coil support structure 20 enables the RF coil assembly 10 to have a relatively large inside diameter to enable the imaging system 300 to image larger patients.

The imaging system 300 also generally includes a controller 330, a main magnetic field control 332, a gradient field control 334, a memory 336, a display device 338, a transmit-receive (T-R) switch 340, an RF transmitter 342 and a receiver 344.

In operation, a body of an object, such as a patient (not shown), or a phantom to be imaged, is placed in the bore 346 on a suitable support, for example, a motorized table (not shown) or the cradle described above. The superconducting magnet 314 produces a uniform and static main magnetic field $B_0$ across the bore 346. The strength of the electromagnetic field in the bore 346 and correspondingly in the patient, is controlled by the controller 330 via the main magnetic field control 332, which also controls a supply of energizing current to the superconducting magnet 314.

The main gradient coil 320, which may include one or more gradient coil elements, is provided so that a magnetic gradient can be imposed on the magnetic field $B_0$ in the bore 346 in any one or more of three orthogonal directions x, y, and z. The main gradient coil 320 is energized by the gradient field control 334 and is also controlled by the controller 330.

The RF coil assembly 10 is arranged to transmit magnetic pulses and/or optionally simultaneously detect MR signals from the patient, if receive coil elements are also provided. The RF coil assembly 10 may be selectably interconnected to one of the RF transmitter 342 or receiver 344, respectively, by the T-R switch 340. The RF transmitter 342 and T-R switch 340 are controlled by the controller 330 such that RF field pulses or signals are generated by the RF transmitter 342 and selectively applied to the patient for excitation of magnetic resonance in the patient.

Following application of the RF pulses, the T-R switch 340 is again actuated to decouple the RF coil assembly 10 from the RF transmitter 342. The detected MR signals are in turn communicated to the controller 330. The controller 330 includes a processor 354 that controls the processing of the MR signals to produce signals representative of an image of the patient. The processed signals representative of the image are also transmitted to the display device 338 to provide a visual display of the image. Specifically, the MR signals fill or form a k-space that is Fourier transformed to obtain a viewable image which may be viewed on the display device 338.

The imaging system 300 also controls the operation of PET imaging. Accordingly, in various embodiments, the imaging system 300 may also include a coincidence processor 348 that is coupled between the detector 10 and a PET scanner controller 350. The PET scanner controller may be coupled to the controller 330 to enable the controller 330 to control the operation of the PET scanner controller 350. Optionally, the PET scanner controller 350 may be coupled to a workstation 352 which controls the operation of the PET scanner controller 350. In operation, the exemplary embodiment, the controller 330 and/or the workstation 352 controls real-time operation of the PET imaging portion of the imaging system 300.

More specifically, in operation, the signals output from the detector 10 are input to the coincidence processor 362. In various embodiments, the coincidence processor assembles information regarding each valid coincidence event into an event data packet that indicates when the event took place and the position of a detector that detected the event. The valid events may then be conveyed to the controller 350 and utilized to reconstruct an image. Moreover, it should be realized that images acquired from the MR imaging portion may be overlaid onto images acquired from the PET imaging portion. The controller 330 and/or the workstation 352 may a central processing unit (CPU) or computer 354 to operate various portions of the imaging system 10. As used herein, the term "computer" may include any processor-based or microprocessor-based system configured to execute the methods described herein. Accordingly, the controller 330 and/or the workstation 352 may transmit and/or receive information from the PET detector assembly 12 to both control the operation of the PET detector assembly 12 and to receive information from the PET detector assembly 12.

The various embodiments and/or components, for example, the modules, or components and controllers therein, such as of the imaging system 400, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" may include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A radio frequency (RF) body coil assembly comprising:
    a coil support structure including an inner tubular member, an outer tubular member disposed radially outwardly from the inner tubular member, and a structural material disposed between the inner and outer tubular members, the coil support structure having a channel formed circumferentially around the inner and outer tubular members;
    an RF coil mounted to an inner surface of the coil support structure; and
    an RF shield disposed on an outer surface of the coil support structure.

2. The RF body coil of claim 1, further comprising a positron emission tomography (PET) detector assembly mounted to the outer surface of the coil support structure, the RF shield being disposed between the PET detector assembly and the coil support structure.

3. The RF body coil of claim 1, wherein the RF shield comprises an RF coating that is formed on an outer surface of the outer tubular member.

4. The RF body coil of claim 1, wherein the structural material comprises a rigid foam material.

5. The RF body coil of claim 1, wherein the outer tubular member comprises a first portion, a second portion, and a third portion, the first and third portions having a first diameter and the second portion having a second diameter that is less than the first diameter forming the channel.

6. The RF body coil of claim 5, wherein the first portion is formed unitarily with the second and third portions.

7. The RF body coil of claim 2, wherein the PET detector assembly configured to mount at least partially within the channel.

8. The RF body coil of claim 7, further comprising a PET detector mounting structure that includes a first end ring, a second end ring, and a plurality of spaced-apart rungs connected between the first and second end rings to form a birdcage, the PET detector mounting structure configured to mount at least partially within the channel.

9. The RF body coil of claim 1, further comprising a scatter shield positioned within the channel.

* * * * *